United States Patent
Yang et al.

(10) Patent No.: US 6,221,772 B1
(45) Date of Patent: Apr. 24, 2001

(54) METHOD OF CLEANING THE POLYMER FROM WITHIN HOLES ON A SEMICONDUCTOR WAFER

(75) Inventors: Chan-Lon Yang, Taipei; Tong-Yu Chen, Hsin-Chu; Wei-Che Huang, Hsin-Tien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/352,747

(22) Filed: Jul. 14, 1999

(51) Int. Cl.[7] ............................................. H01L 21/302
(52) U.S. Cl. .................. 438/689; 438/691; 438/672; 438/711
(58) Field of Search ............................ 438/672, 675, 438/689, 709, 710, 711, 725, 726, 727, 728, 729, 254, 692

(56) References Cited

U.S. PATENT DOCUMENTS 5,895,239 * 4/1999 Jeng et al. ............................ 438/254

* cited by examiner

Primary Examiner—Tuan H. Nguyen
Assistant Examiner—Yennhu B. Huynh
(74) Attorney, Agent, or Firm—Winston Hsu

(57) ABSTRACT

The present invention provides a method of in-situ cleaning polymers from holes on a semiconductor wafer and in-situ removing the silicon nitride layer. The semiconductor wafer comprising a substrate, a silicon nitride ($Si_3N_4$) layer on the substrate, a silicon oxide ($SiO_2$) layer on the silicon nitride layer, and a photo-resist layer on the silicon oxide layer. The silicon oxide layer and the photo-resist layer have a hole extending down to the silicon nitride layer. The hole contains polymer left after etching of the silicon oxide layer. The method comprises performing a in-situ plasma ashing process by injecting oxygen ($O_2$) and argon (Ar) to completely remove the photo-resist layer and the polymer remaining within the hole. Subsequently, the silicon nitride layer was removed in the same chamber. The flow rate of $O_2$ is maintained between 50~2000 sccm (standard cubic centimeter per minute) and the flow rate of Ar is maintained between 50~500 sccm.

6 Claims, 4 Drawing Sheets

METHOD OF CLEANING THE POLYMER FROM WITHIN HOLES ON A SEMICONDUCTOR WAFER

BACKGROUND OF THE INVENTION

1. Field of the invention

The present invention relates to a method of cleaning away polymer, and more particularly, to a method of cleaning polymer inside contact holes on a semiconductor wafer.

2. Description of the prior art

The inter-layer dielectric (ILD) positioned between the MOS transistor and the metallic conductive layer on the semiconductor wafer isolates and protects devices of the semiconductor wafer. A contact plug positioned within the ILD is employed as an electrical terminal between the MOS transistor and the metallic conductive layer. The contact plug is formed through etching a contact hole onto the ILD then filling the hole with metallic material.

In semiconductor processing at widths less than 0.25 um, a borderless contact structure is generally used to allow shorter distance between the contact hole and border of each layer so as to increase the device density on the semiconductor wafer. The borderless contact structure according to the prior art comprises a silicon nitride layer employed as a stop-etching layer positioned between the ILD and the MOS transistor. The ILD is made of silicon oxide and positioned above the MOS transistor. Because etching stops at the silicon nitride layer during processing of the borderless contact holes, etching of oxide layer in shallow trench isolation (STI) is prevented on the part of the MOS transistor.

Please refer to FIG. 1. FIG. 1 is a structural schematic diagram of the borderless contact holes 24, 26 on the semiconductor wafer 10 according to the prior art. The semiconductor wafer 10 comprises a substrate 12, a MOS transistor 14, a shallow trench 16, a silicon nitride layer 18, a silicon oxide layer 20 and two borderless contact holes 24, 26. The MOS transistor 14 and the shallow trench 16 are both positioned on the substrate 12. The silicon nitride layer 18 is positioned on the MOS transistor 14. The silicon oxide layer 20 is deposited on the silicon nitride layer 18.

Please refer to FIG. 2 to FIG. 4. FIG. 2 to FIG. 4 are schematic diagrams of forming the borderless contact holes 26 as shown in FIG. 1. As shown in FIG. 2, the nitride layer 18 and the silicon oxide layer 20 are sequentially deposited on the substrate 12. Then, a photo-resist layer 22 is formed in a predetermined area of the silicon oxide layer 20. Next, the position of the borderless contact hole 26 is defined by using the pattern transfer of a photomask. Next, as shown in FIG. 3, an anisotropic dry-etching process is performed on the portion of the silicon oxide layer 20 not covered by the photo-resist layer 22 to form an opening 28 by removing the silicon oxide layer 20 down to the silicon nitride layer 18. This dry-etching process employs fluorocarbon ($C_4F_8$) and argon (Ar) as reacting gases and adds carbon monoxide (CO) to the reacting gases for adjusting the ratio of fluorine atoms to carbon atoms (F/C). Finally, as shown in FIG. 4, an etching process is performed on the silicon nitride layer 18 and a removing process is performed on the photo-resist layer 22 respectively. This completes processing of the borderless contact holes.

After dry-etching of the silicon nitride layer 18, polymers remain on the side and the bottom surface of the borderless contact hole 26 leading to a smaller contact area between the borderless contact hole 26 and the source and drain of the MOS transistor 14. The polymers on the bottom side of each contact hole 26, 28 also affect the surface condition and bonding of the metal layer in subsequent metallization processes. Therefore, the contact plug subsequently formed by filling metallic material in the contact hole 26 through metallic sputtering has a high resistance in excess of 5 ohms. In order to prevent increases of the resistance of the contact plug, the polymer remaining in the borderless contact hole 26 after the borderless contact hole 26 need to be completed cleaned out.

After dry-etching to form the opening in the region not covered by the photo-resist layer 22, polymer containing carbon atom is also generated from the etched silicon oxide that remain on the side of the opening 28 and the surface of the silicon nitride layer 18. These polymers affect the subsequent dry-etching process on the silicon nitride layer 18 as well as the after etching inspection critical dimension (AEI CD) of the borderless contact hole 26. Furthermore, the source or drain of the MOS transistor 14 may contain leftover polymer so as to form defects during the dry-etching process on the silicon nitride layer 18. However, if the polymers remaining within the opening 28 are removed at the same time the dry-etching process on the silicon nitride layer is performed, the etching selective ratio of silicon oxide to silicon nitride will be decreased during the dry-etching process. Thus, it is difficult to stop etching the silicon nitride layer 18 at the right time.

SUMMARY OF THE INVENTION

It is therefore a primary objective of the present invention to provide a method of in-situ cleaning the polymer from holes on a semiconductor wafer and in-situ remove the silicon nitride layer, to solve those problems generated from forming a borderless contact hole.

In a preferred embodiment, the present invention provides a method of in-situ cleaning polymers in holes and in-situ remove the silicon nitride layer on a semiconductor wafer; the semiconductor wafer comprising a substrate, a silicon nitride ($Si_3N_4$) layer on the substrate, a silicon oxide ($SiO_2$) layer on the silicon nitride layer, and a photo-resist layer on the silicon oxide layer; the silicon oxide layer and the photo-resist layer having a hole extending down to the silicon nitride layer, the hole containing polymer left by etching of the silicon oxide layer, the method comprising:

performing a in-situ plasma ashing process by injecting oxygen ($O_2$) and argon (Ar) to completely remove the photo-resist layer and the polymer remaining within the hole, the flow rate of $O_2$ being maintained between 50~2000 sccm (standard cubic centimeter per minute) and the flow rate of Ar being maintained between 50~500 sccm.

It is an advantage of the present invention that using the method of in-situ cleaning the polymers from within the holes, the polymer remaining within the holes may be cleaned out to form a borderless contact hole with an unbroken outline. This is helpful to increase the yield of semiconductor products.

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
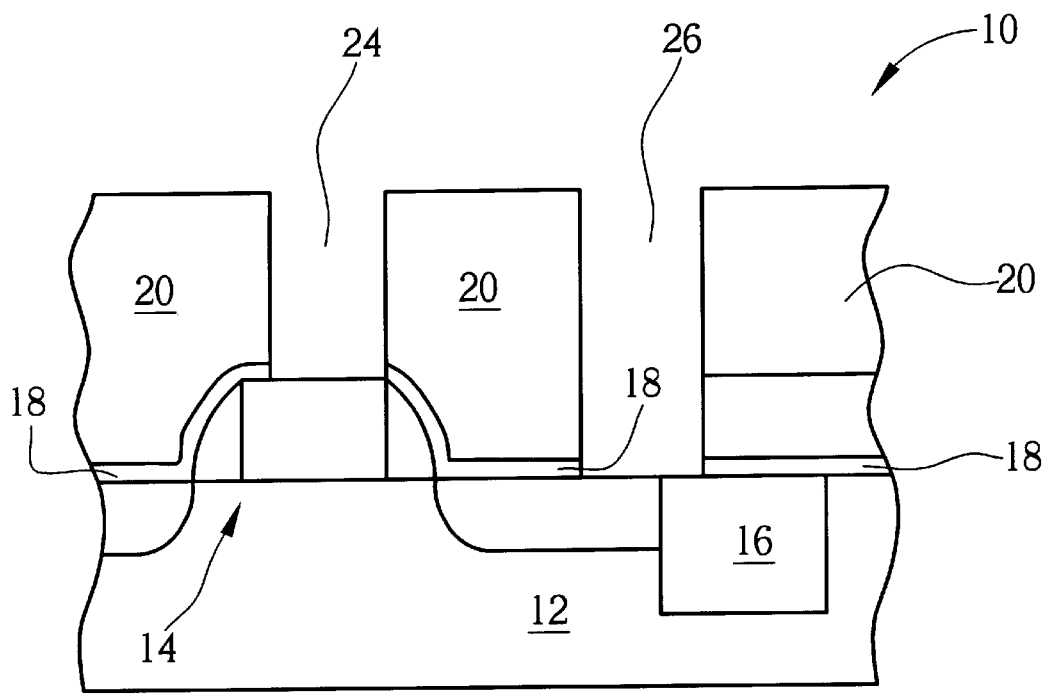
FIG. 1 is a structural schematic diagram of the borderless contact holes on the semiconductor wafer according to the prior art.
Figure 2:
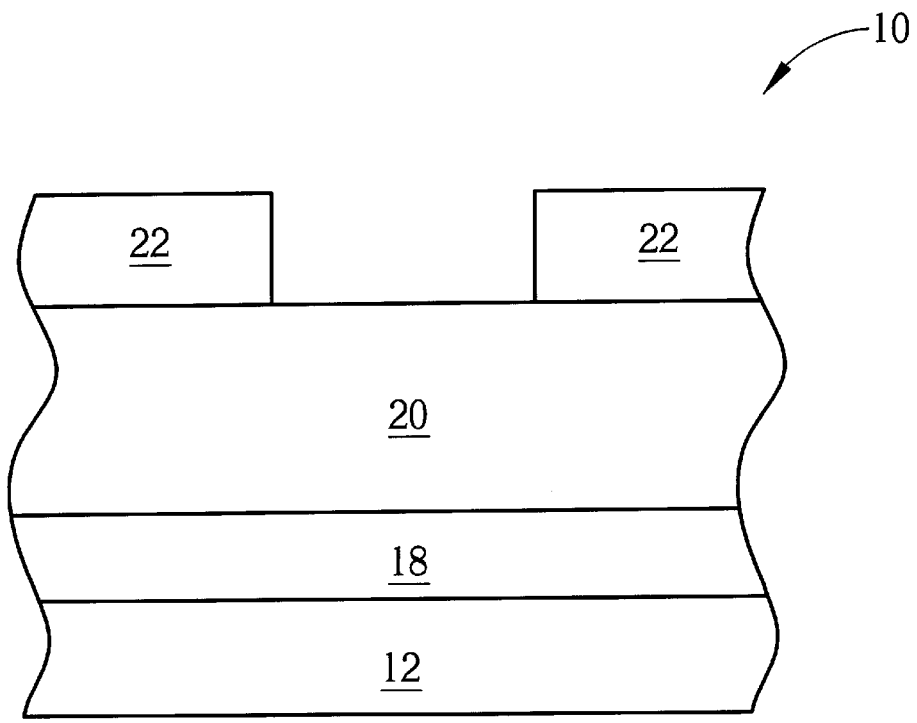
FIG. 2 to FIG. 4 are schematic diagrams of forming the borderless contact holes as shown in FIG. 1.
Figure 3:
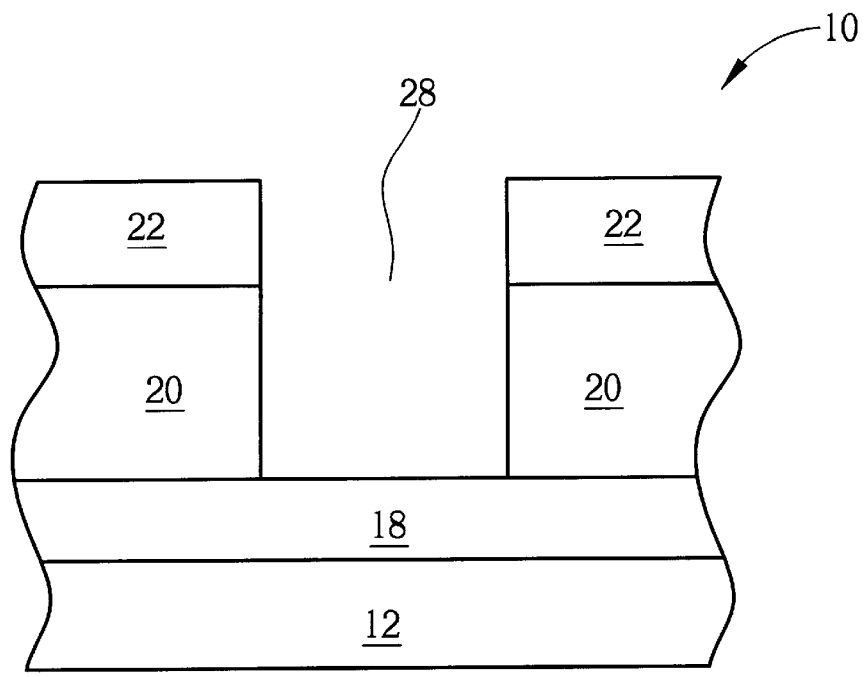
Figure 4:
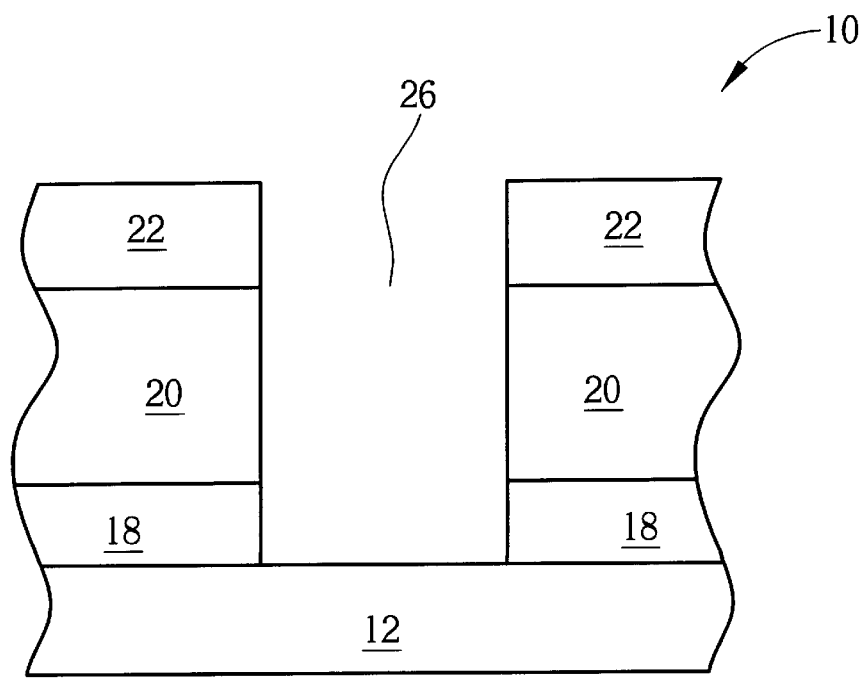
Figure 5:
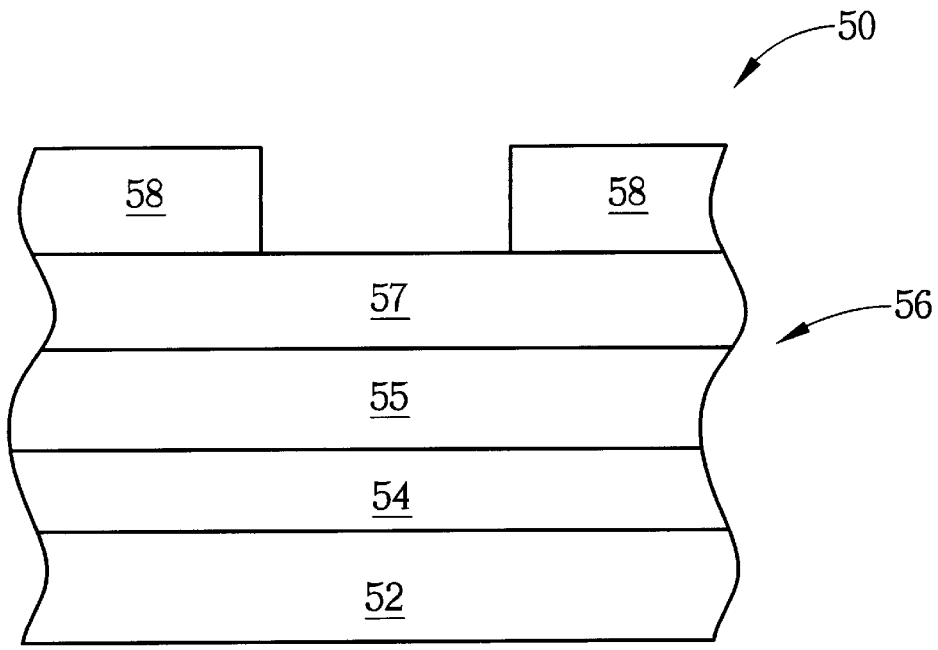
FIG. 5 to FIG. 8 are schematic diagrams of forming the borderless contact hole by using the method of cleaning the polymer according to the present invention.

Please refer to FIG. 5 to FIG. 8. FIG. 5 to FIG. 8 are schematic diagrams of forming the borderless contact hole 62 by using the method of cleaning the polymer according to the present invention. The present invention method of cleaning the polymer from within holes on a semiconductor wafer and its control parameters solve the problems of the prior art method of forming a borderless contact hole. At the same time, a good borderless contact plug may also be formed. As shown in FIG. 5, a silicon nitride layer 54 and a silicon oxide layer 56 are sequentially deposited on the substrate 52 of the semiconductor wafer 50. Then, a photo-resist layer 58 is formed on a predetermined area of the silicon oxide layer 56. Next, the position of the borderless contact hole 62 is defined by using the pattern transfer of a photomask. The silicon oxide layer 56 comprises a silicon dioxide ($SiO_2$) made by high density plasma-enhanced chemical vapor deposition (HDP CVD) positioned on the silicon nitride 54, and a phosphosilicate glass layer 57 positioned on the silicon dioxide layer 55.

Figure 6:
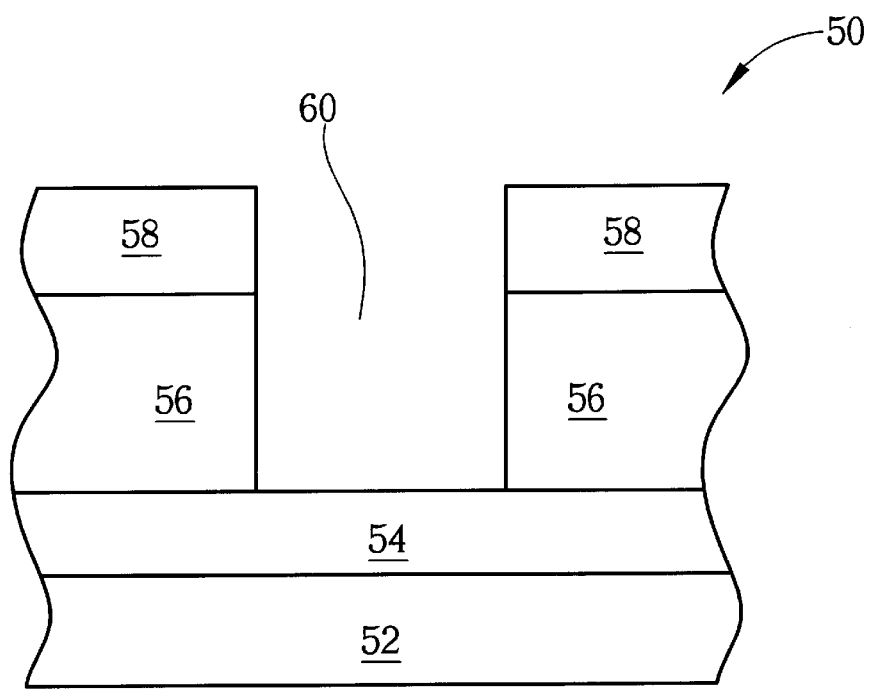

Next, as shown in FIG. 6, an anisotropic dry-etching process is performed on the portion of the silicon oxide layer 56 not covered by the photo-resist layer 58 to remove the silicon oxide layer 56 according to the pattern of the photo-resist layer 58 in a downward direction. Thus, an opening 60 extending down to the silicon nitride layer 54 is formed. The dry-etching process is performed in a chamber by injecting fluorocarbon ($C_4F_8$) and Ar as the reacting gases and CO for adjusting the ratio of fluorine to carbon atoms in the reacting gases.

Figure 7:
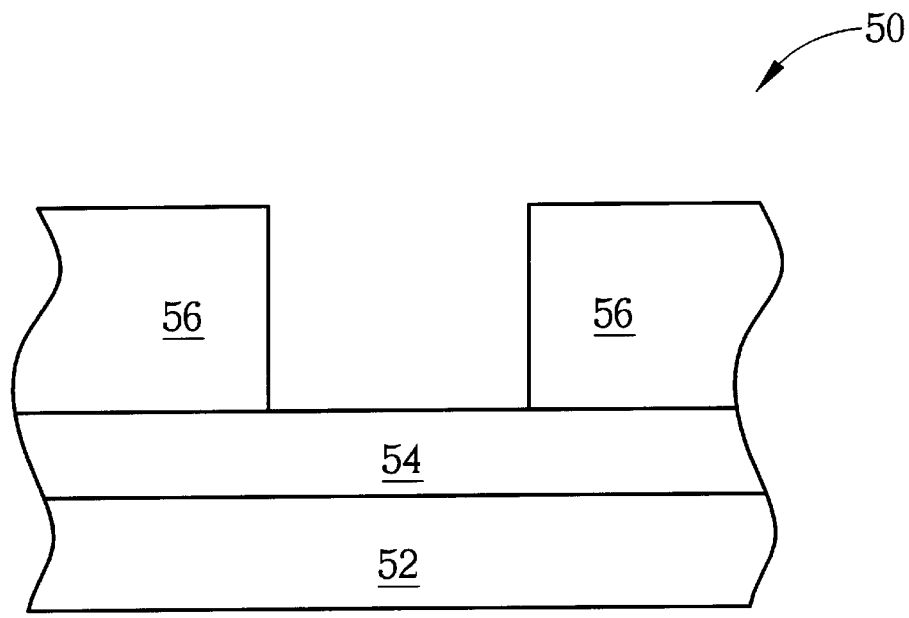
Figure 8:
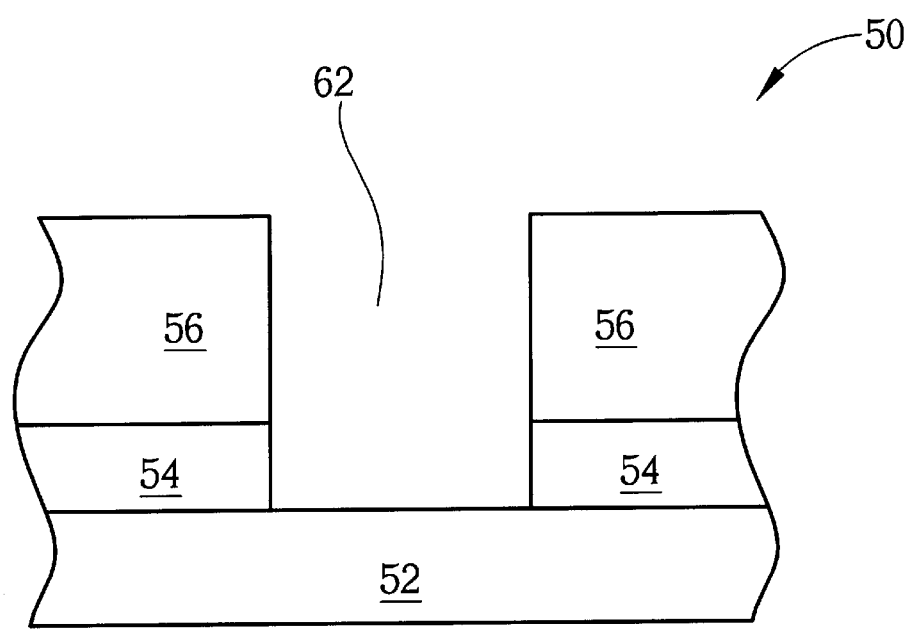

Then, as shown in FIG. 7, a in-situ plasma ashing process is performed by injecting $O_2$ and Ar to completely remove the photo-resist layer 58 and the polymers remaining on the side of the opening 60 and on the surface of the silicon nitride layer 54. The in-situ plasma ashing process is performed in the same chamber at the pressure of 5~1000 mTorr, a wafer backside chilling temperature of –20~20° C., an $O_2$ flow rate of 50~2000 sccm (standard cubic centimeter per minute) and an Ar flow rate of 50~500 sccm. The source power during the plasma ashing process is between 1500~4000 watts, and the bias power is between 0~500 watts . Next, as shown in FIG. 8, a in-situ dry-etching process is performed on the opening 60 to remove the silicon nitride layer 54 in a downward direction so as to form a borderless contact hole 62 extending down to the substrate 52. Finally, the in-situ plasma ashing process is performed again to clean off the polymers remaining within the borderless contact hole 62.

During the dry-etching process of the silicon oxide layer 56, the reacting gases in the chamber are bombarded by plasma to form partially ionized gas that is used for ion bombardment of the semiconductor wafer 50. Therefore, the opening 60 extending down to the silicon nitride layer 54 is formed by removing the silicon oxide layer 56 not covered by the photo-resist layer 58. However, the reacting gases comprise fluorocarbon compounds and may chemically react with the silicon oxide layer 56 to form polymers. These polymers may remain within the opening 60 and be continuously deposited in the opening 60 to form an assumed protective layer. The assumed protective layer impedes dry-etching of the silicon oxide layer 56, so subsequent dry-etching on the silicon nitride 54 is more difficult to perform and may even bring about defects on the etched source or drain of the MOS transistor 14.

The method of cleaning the polymers in the opening 60 on the semiconductor wafer 50 according to the present invention employs the in-situ plasma ashing process performed in the same chamber after the dry-etching process of the silicon oxide layer 56. The purpose of the in-situ plasma ashing process is to clean off the polymers remaining within the opening 60 and on the silicon nitride layer 54. Subsequently, the in-situ dry-etching process of the silicon nitride layer 54 can be performed later to form the borderless contact hole 62 with an unbroken outline. Also, the photo-resist layer 58 positioned on the silicon oxide layer 56 can be removed at the same time when the polymers remaining within the opening 60 are cleaned off.

Compared to the prior method of forming the borderless contact hole 26, the present invention uses the in-situ plasma ashing process performed immediately after the dry-etching process of the silicon oxide layer 56. The plasma ashing process cleans off the polymers remaining within the opening 60 and removes the photo-resist layer 58 covering the silicon nitride layer 56. Therefore, the borderless contact hole 62 is formed with new polymer cleaning process to increase the yield of semiconductor products.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of in-situ cleaning polymers in holes on a semiconductor wafer; the semiconductor wafer comprising a substrate, a silicon nitride ($Si_3N_4$) layer on the substrate, a silicon oxide ($SiO_2$) layer on the silicon nitride layer, and a photo-resist layer on the silicon oxide layer; the silicon oxide layer and the photo-resist layer having a hole extending down to the silicon nitride layer, the hole containing polymer left by etching of the silicon oxide layer, the method comprising:

performing a in-situ plasma ashing process by injecting oxygen ($O_2$) and argon (Ar) to completely remove the photo-resist layer and the polymers remaining within the contact holes, the flow rate of $O_2$ being maintained between 50~2000 sccm (standard cubic centimeter per minute) and the flow rate of Ar being maintained between 50~500 sccm.

2. The method of claim 1 wherein the source power during the plasma ashing process is between 1500~4000 watts, and the bias power between 0~500 watts.

3. The method of claim 2 wherein the plasma ashing process is performed in a chamber at a pressure of 5~1000 mTorr and a temperature of –20~20° C.

4. The method of claim 1 wherein the hole is part of the structure of a contact hole for forming a borderless contact plug.

5. The method of claim 1 wherein the silicon oxide layer comprises phosphosilicate glass and silicon dioxide, the silicon dioxide being made by high-density plasma-enhanced chemical vapor deposition (HDP CVD).

6. The method of claim 1 further comprises a in-situ silicon nitride strip process after the in-situ plasma ashing process to remove the silicon nitride layer within the holes on the semiconductor wafer.

* * * * *